(12) United States Patent
Chen et al.

(10) Patent No.: US 9,861,193 B2
(45) Date of Patent: Jan. 9, 2018

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/296,276

(22) Filed: Oct. 18, 2016

(65) Prior Publication Data

US 2017/0196354 A1   Jul. 13, 2017

(30) Foreign Application Priority Data

Jan. 12, 2016   (TW) .............................. 105100882 A

(51) Int. Cl.
- *A47B 57/38* (2006.01)
- *A47B 57/40* (2006.01)
- *A47B 96/07* (2006.01)

(52) U.S. Cl.
CPC ............ *A47B 57/38* (2013.01); *A47B 57/406* (2013.01); *A47B 96/07* (2013.01)

(58) Field of Classification Search
CPC ....... A47B 57/38; A47B 96/07; A47B 57/406; A47B 57/14; A47B 57/16; A47B 57/40; A47B 95/00; A47B 88/04

USPC ..... 248/218.4, 219.1, 219.3, 221.11, 222.14, 248/244; 211/192, 26, 162, 175, 782; 312/334.4, 334.46
See application file for complete search history.

(56) References Cited

U.S. PATENT DOCUMENTS

| | | | |
|---|---|---|---|
| 4,406,374 A * | 9/1983 | Yedor ................... | A47B 57/40 211/192 |
| 4,712,286 A * | 12/1987 | Wolf ...................... | A47B 57/40 138/160 |
| 6,929,339 B1 * | 8/2005 | Greenwald .......... | H05K 7/1421 211/26 |
| 6,948,691 B2 * | 9/2005 | Brock ...................... | H02B 1/34 211/175 |
| 7,357,362 B2 | 4/2008 | Yang et al. | |
| 7,699,279 B2 | 4/2010 | Chen et al. | |
| 7,731,142 B2 | 6/2010 | Chen et al. | |
| 8,104,626 B2 * | 1/2012 | Huang ................... | A47B 88/43 211/26 |
| 8,371,454 B2 | 2/2013 | Chen et al. | |
| 8,727,138 B2 * | 5/2014 | Dittus ..................... | H05K 7/183 211/26 |
| 9,125,489 B2 * | 9/2015 | Chen ..................... | A47B 88/044 |

(Continued)

*Primary Examiner* — Muhammad Ijaz
(74) *Attorney, Agent, or Firm* — Rosenberg, Klein & Lee

(57) ABSTRACT

A bracket device includes a bracket, at least one mounting member, and a hook. The bracket has an end plate. The at least one mounting member is mounted on the end plate of the bracket. The hook is movably connected to the bracket in order to be at either one of a first position and a second position with respect to the bracket. The hook is extended with respect to the end plate of the bracket when at the first position and is retracted with respect to the end plate of the bracket when at the second position.

18 Claims, 11 Drawing Sheets

(56) References Cited

U.S. PATENT DOCUMENTS

| | | | |
|---|---|---|---|
| 9,375,087 B1* | 6/2016 | Chen | A47B 88/43 |
| 2001/0040203 A1* | 11/2001 | Brock | H02B 1/34 |
| | | | 248/222.11 |
| 2004/0104184 A1* | 6/2004 | Hartman | G06F 1/183 |
| | | | 211/26 |
| 2004/0108427 A1* | 6/2004 | Chen | A47B 57/40 |
| | | | 248/244 |
| 2007/0012836 A1* | 1/2007 | Krueger | H05K 7/1421 |
| | | | 248/239 |
| 2008/0073469 A1* | 3/2008 | Mushan | H05K 7/1489 |
| | | | 248/205.1 |
| 2009/0114785 A1* | 5/2009 | Huang | H05K 7/1489 |
| | | | 248/220.31 |
| 2009/0166485 A1* | 7/2009 | Chen | A47B 88/43 |
| | | | 248/200 |
| 2012/0312943 A1* | 12/2012 | Fan | H05K 7/1489 |
| | | | 248/222.11 |
| 2014/0070064 A1* | 3/2014 | Chen | A47B 88/044 |
| | | | 248/221.11 |
| 2014/0104777 A1 | 4/2014 | Henderson | |
| 2014/0265788 A1* | 9/2014 | Judge | H05K 7/1489 |
| | | | 312/334.1 |

* cited by examiner

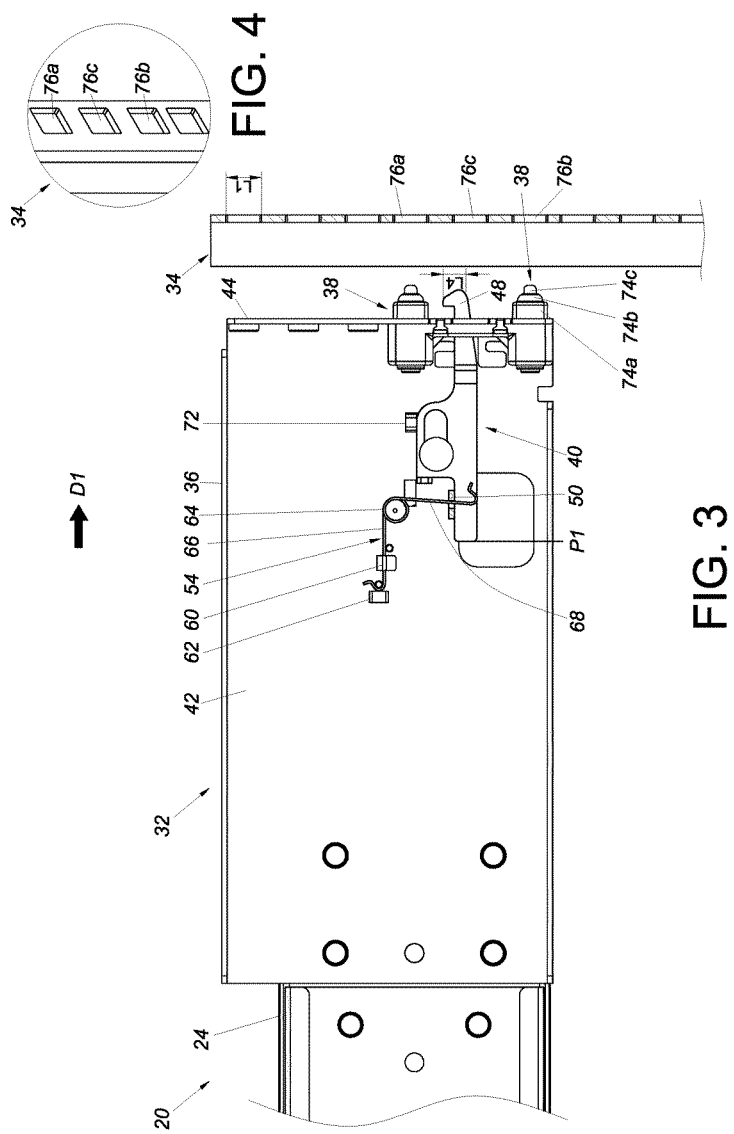

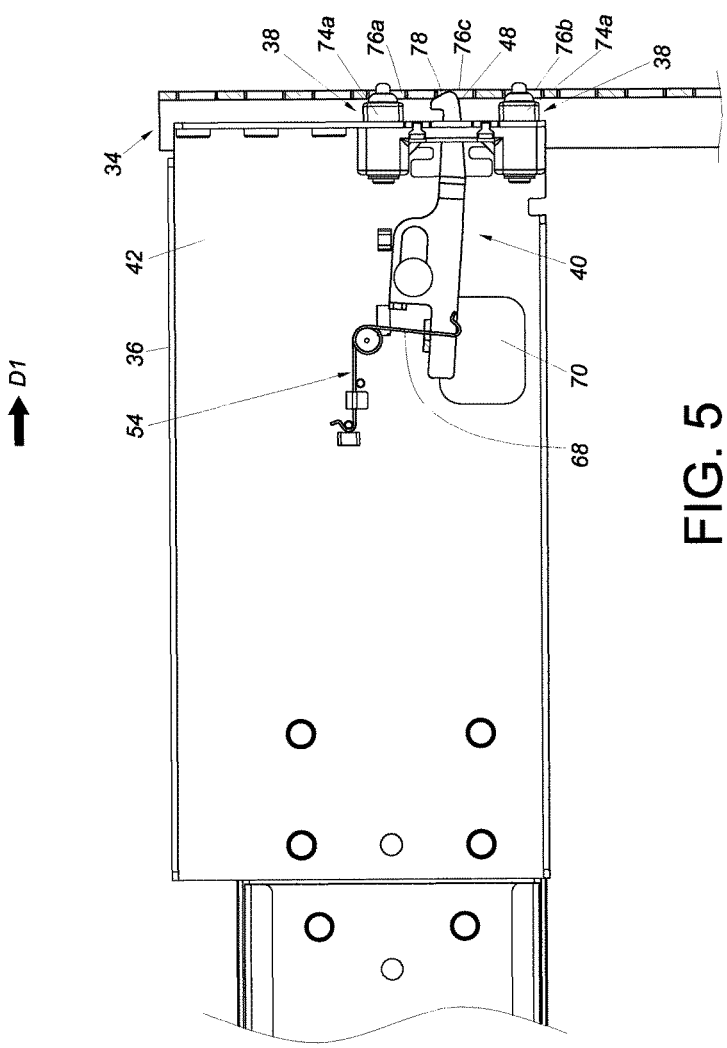

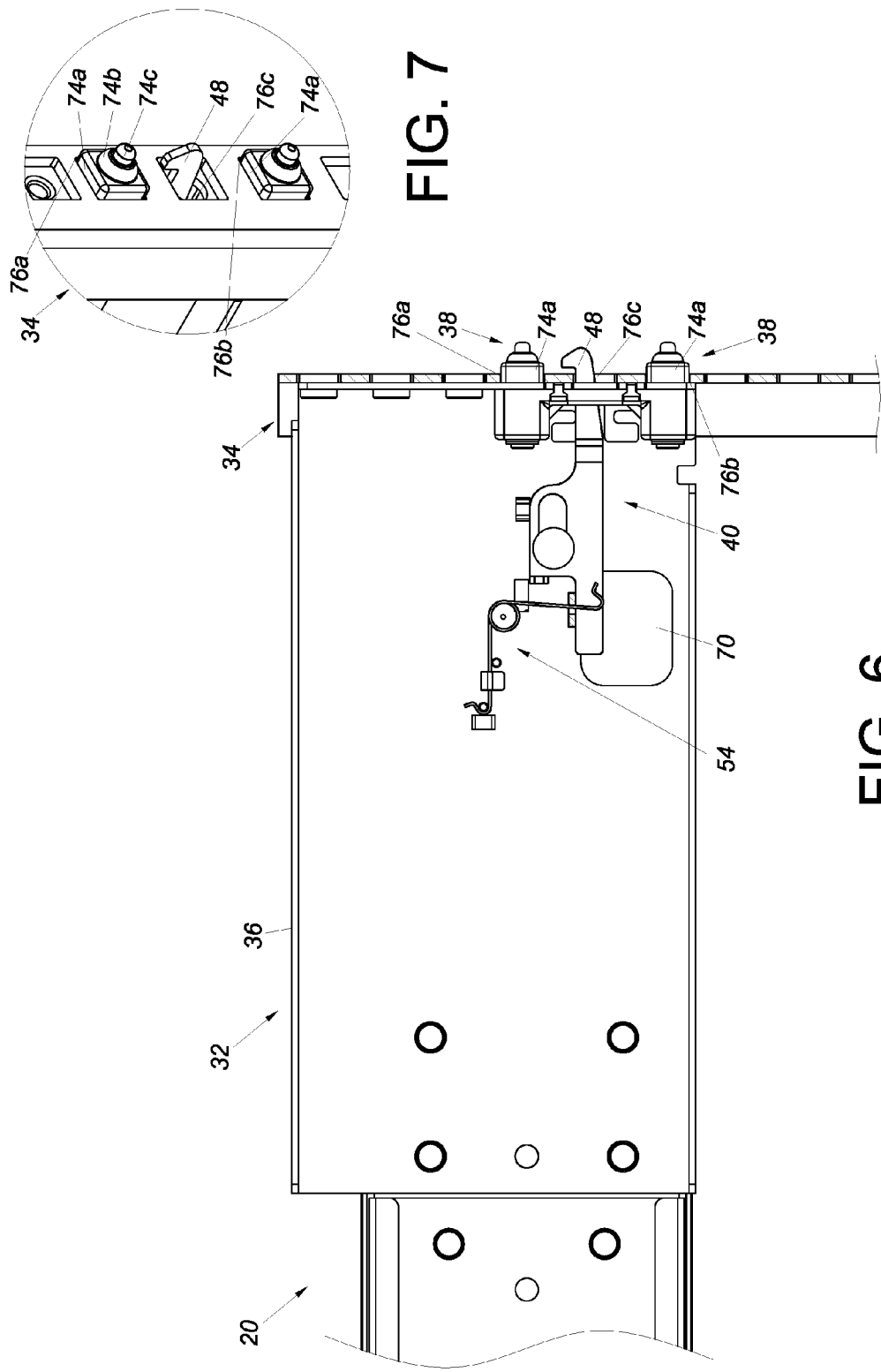

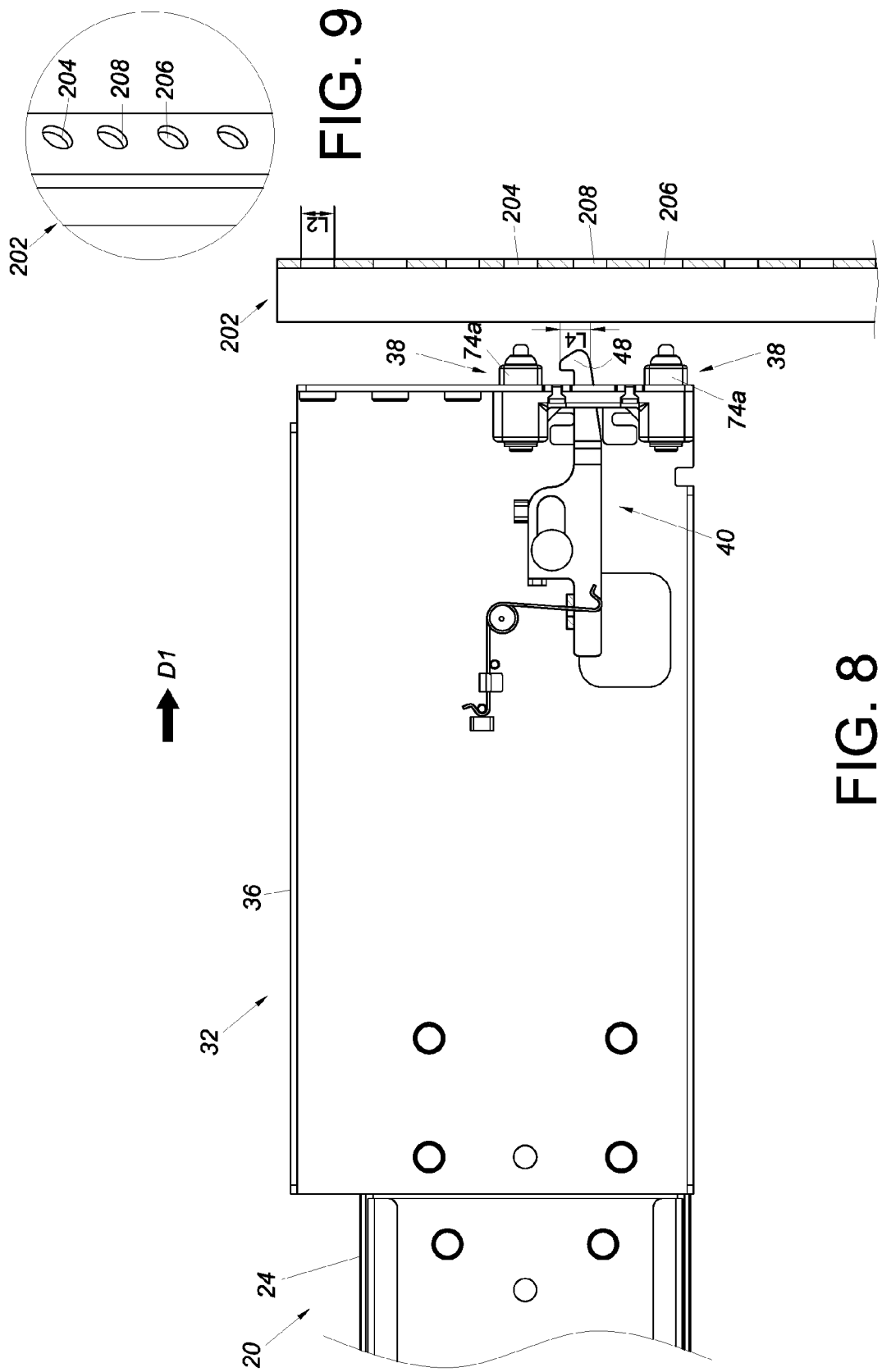

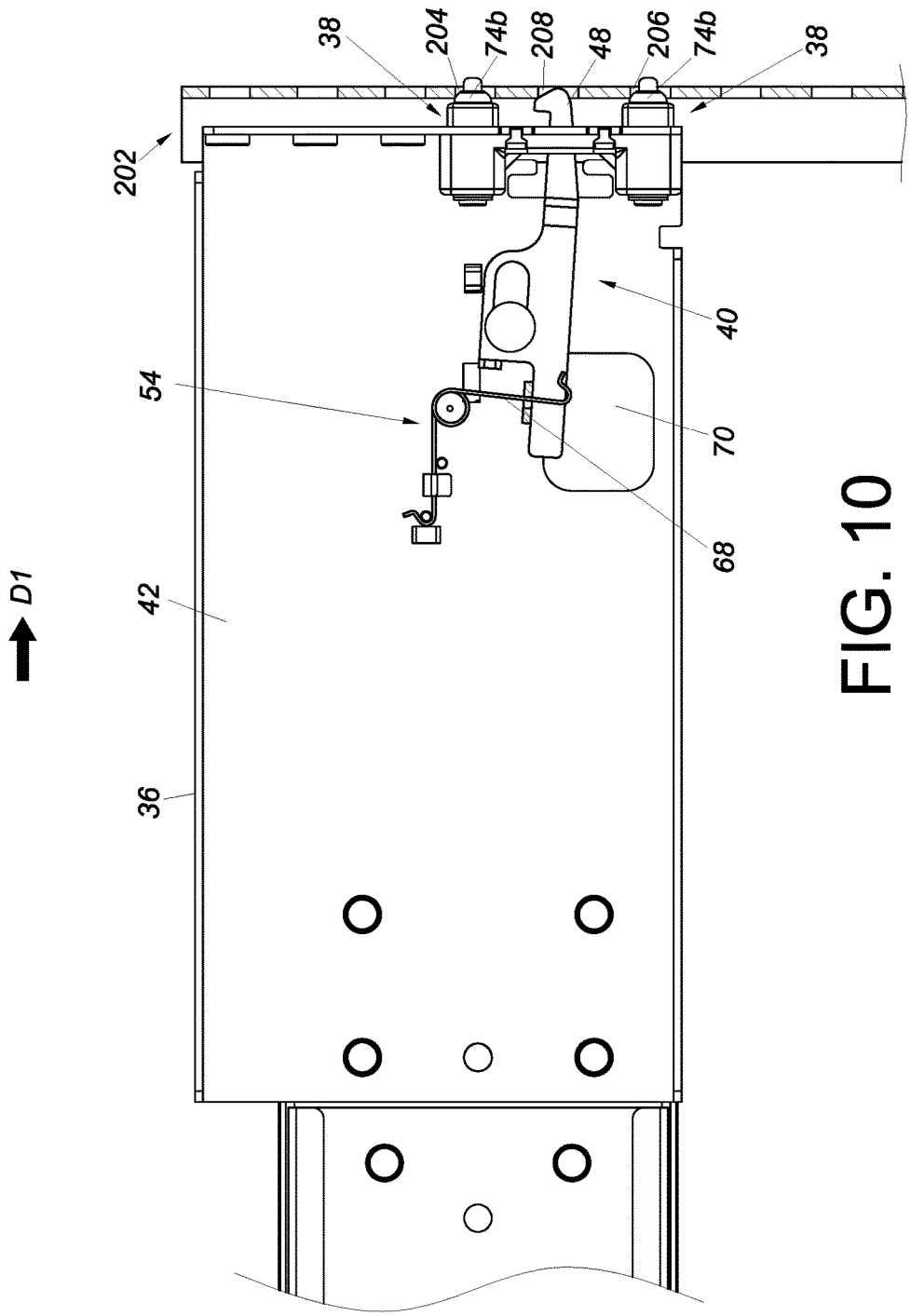

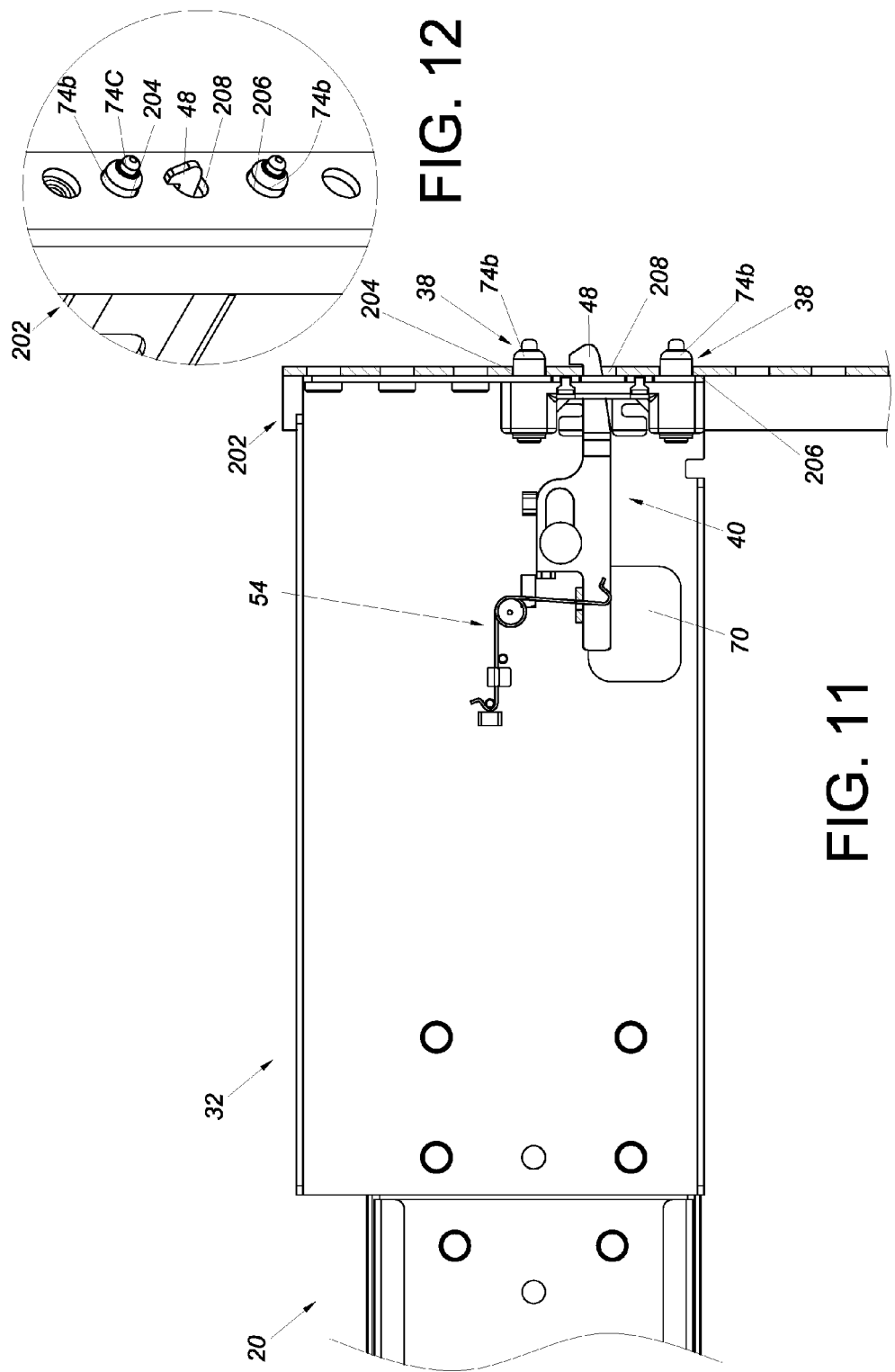

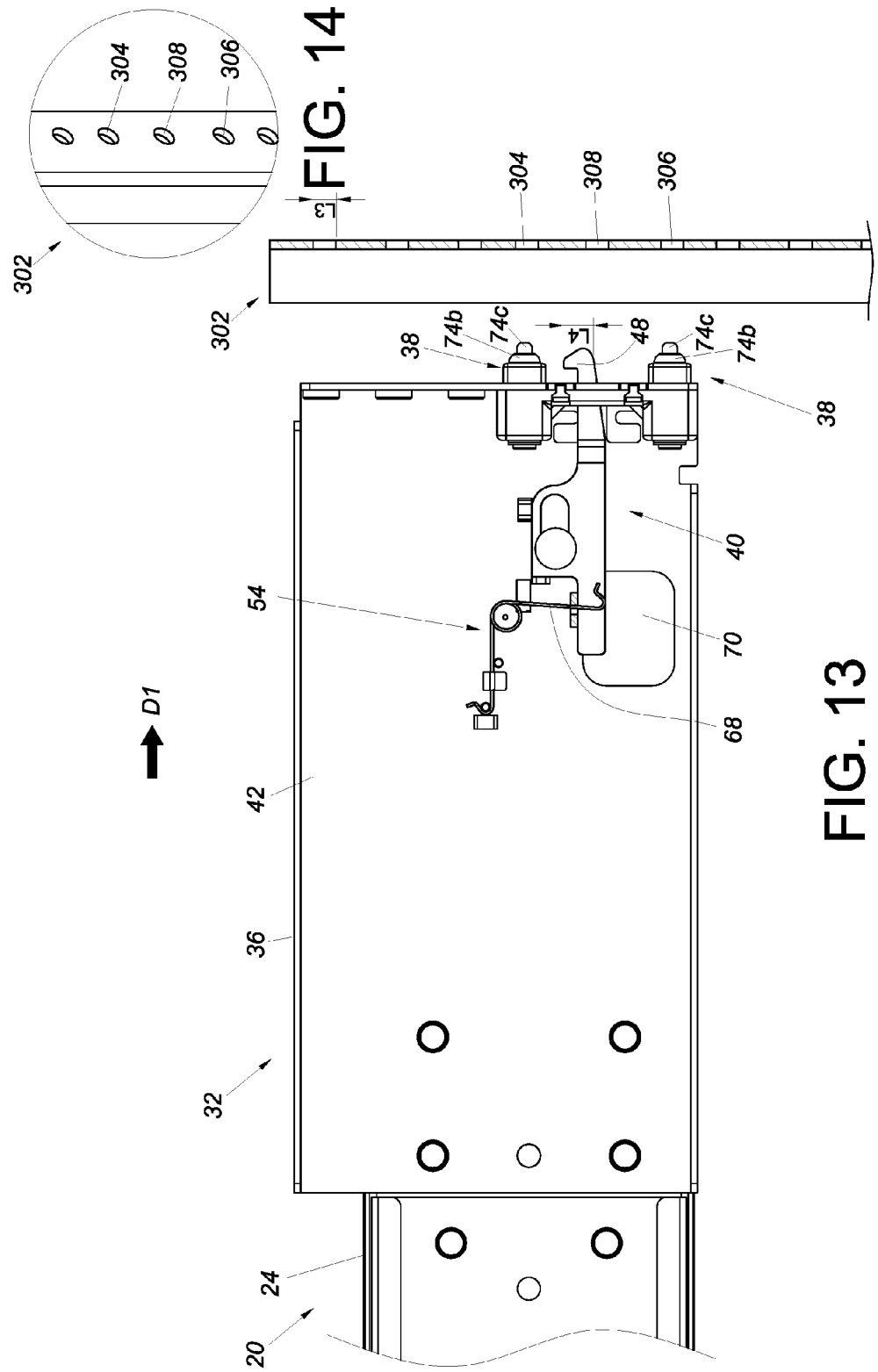

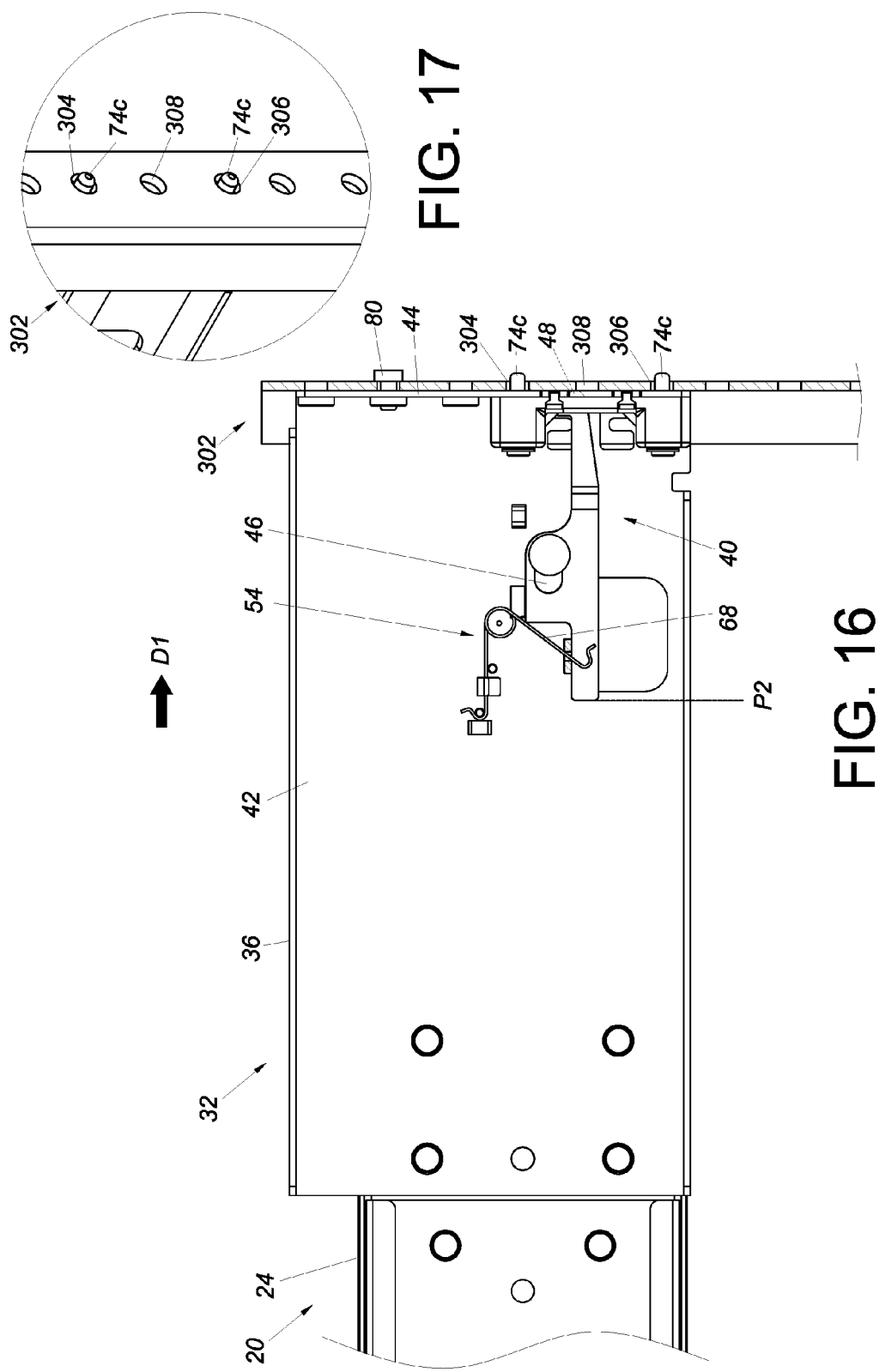

BRACKET DEVICE

FIELD OF THE INVENTION

The present invention relates to a bracket device and more particularly to one configured to mount a slide rail to a post of a rack.

BACKGROUND OF THE INVENTION

Generally, a piece of rack-mounted equipment is mounted to a rack by a pair of slide rail assemblies. For example, US Patent Publication No. 2014/0104777 A1 discloses a rail adapter for tool-less coupling to a rack. The adapter is coupled to a rail in order to mount the rail to a rack. More specifically, the adapter (32) is mounted on a mount (28) of the rail (16). The adapter (32) also has a latch (38) as shown in FIG. 5 and FIG. 6 accompanying the specification of the afore-cited patent application. The rail (16) is mounted to a plurality of openings (26) of the rack (12) via the latch (38) and a support (36). As the openings may vary in shape and size from one rack to another, it is highly desirable to have a medium member or device that enables a rail to cope with racks of different specifications as much as possible.

SUMMARY OF THE INVENTION

The present invention relates to a bracket device which can be mounted to rack posts of different specifications.

According to one aspect of the present invention, a bracket device includes a bracket and a hook. The hook is movably connected to the bracket and allowed to be at either one of a first position and a second position with respect to the bracket. The hook is extended with respect to the end plate of the bracket when at the first position and is retracted when at the second position.

Preferably, the bracket device further includes at least one mounting member, and the at least one mounting member is mounted on the end plate of the bracket.

Preferably, the bracket device has a longitudinal plate, and the end plate is substantially perpendicularly connected to the longitudinal plate.

In some embodiments according to the foregoing aspect, one of the hook and the bracket has a longitudinal guiding feature, and the hook can be longitudinally displaced with respect to the bracket via the longitudinal guiding feature. Preferably, the longitudinal guiding feature is a longitudinal hole, and the bracket device further includes a pivotal connection member, the pivotal connection member extending through a portion of the longitudinal hole and mounting the hook to the bracket.

In some embodiments according to the foregoing aspect, the bracket device further includes an elastic member for applying an elastic force to the hook so that the hook can stay at the first position in response to the elastic force of the elastic member.

In some embodiments according to the foregoing aspect, the longitudinal plate of the bracket includes a protruding block, and one side of the hook can be pressed against the protruding block.

In some embodiments according to the foregoing aspect, the at least one mounting member includes a first mounting portion and a second mounting portion, and the first mounting portion is larger in size than the second mounting portion. Preferably, the at least one mounting member further includes a third mounting portion, and the second mounting portion is larger in size than the third mounting portion.

In some embodiments according to the foregoing aspect, the bracket is mountable to a slide rail and adapted for mounting the slide rail to a post, wherein the post has a plurality of holes. While the slide rail is being mounted to the post in a first direction via the bracket device, the hook is pressed against the post, adjacent to one of the holes, and eventually displaced from the first position to the second position in a second direction. The at least one mounting member, on the other hand, is mounted to another of the holes of the post in the first direction. Preferably, the one of the holes of the post is smaller in size than the hook, so while the slide rail is being mounted to the post in the first direction via the bracket device, the hook cannot pass through the one of the holes in the first direction but is pressed against the post.

BRIEF DESCRIPTION OF THE DRAWINGS

FIG. 3 shows how a slide rail assembly is mounted to a post of a rack via a bracket device according to an embodiment of the present invention;

FIG. 4 is a partial perspective view of the rack post in FIG. 3;

FIG. 5 shows a slide rail assembly being mounted to the rack post in FIG. 3 via a bracket device according to an embodiment of the present invention;

FIG. 6 shows a slide rail assembly mounted on the rack post in FIG. 3 via a bracket device according to an embodiment of the present invention;

FIG. 7 is a partial perspective view showing how a bracket device according to an embodiment of the present invention is mounted on the rack post in FIG. 3;

FIG. 8 shows how a slide rail assembly is mounted to the post of another rack via a bracket device according to an embodiment of the present invention;

FIG. 9 is a partial perspective view of the rack post in FIG. 8;

FIG. 10 shows a slide rail assembly 8 being mounted to the rack post in FIG. 8 via a bracket device according to an embodiment of the present invention;

FIG. 11 shows a slide rail assembly mounted on the rack post in FIG. 8 via a bracket device according to an embodiment of the present invention;

FIG. 12 is a partial perspective view showing how a bracket device according to an embodiment of the present invention is mounted on the rack post in FIG. 8;

FIG. 13 shows how a slide rail assembly is mounted to the post of still another rack via a bracket device according to an embodiment of the present invention;

FIG. 14 is a partial perspective view of the rack post in FIG. 13;

FIG. 16 shows a slide rail assembly mounted on the rack post in FIG. 13 via a bracket device according to an embodiment of the present invention; and FIG. 17 is a partial perspective view showing how a bracket device according to an embodiment of the present invention mounted on the rack post in FIG. 13.

DETAILED DESCRIPTION OF THE INVENTION

Figure 1:
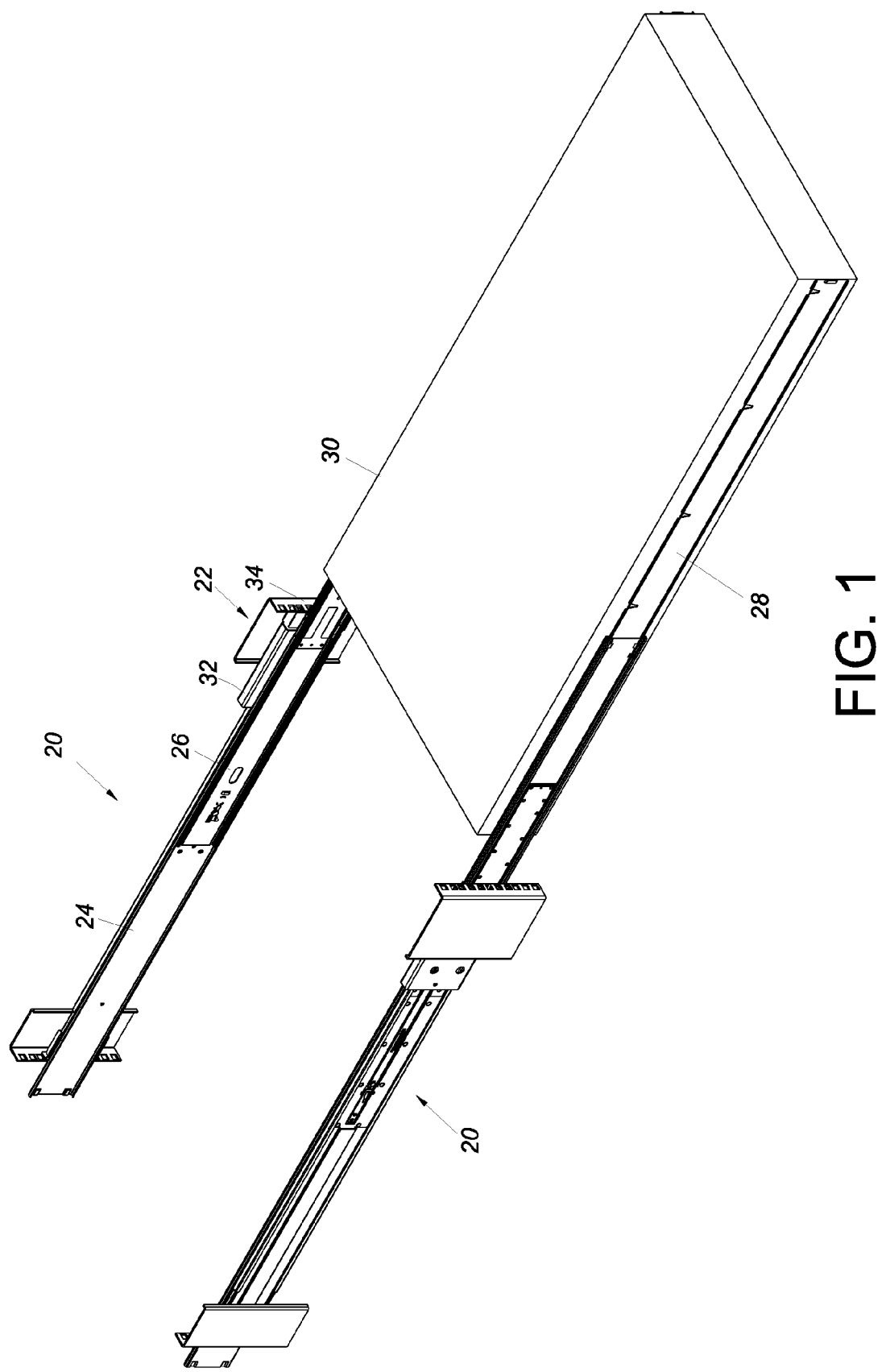
FIG. 1 is a perspective view showing how a pair of slide rail assemblies are mounted to a rack via a pair of bracket devices according to an embodiment of the present invention.

FIG. 1 shows how a pair of slide rail assemblies 20 are mounted to a rack 22 according to an embodiment of the present invention. Each slide rail assembly 20 includes a plurality of slide rails such as a first rail 24, a second rail 26, and a third rail 28, wherein the rails are connected together in a sequentially movable manner. The third rails 28 are configured to be mounted with an object 30 so that the object 30 can be pulled out of the rack 22. More specifically, the first rail 24 of each slide rail assembly 20 has a front portion and a rear portion, and each of these portions can be mounted to a post of the rack 22 via a bracket. The following paragraphs show the features of the present invention by detailing how the first rail 24 of one of the slide rail assemblies 20 is mounted to a post 34 via a bracket device 32.

Figure 2:
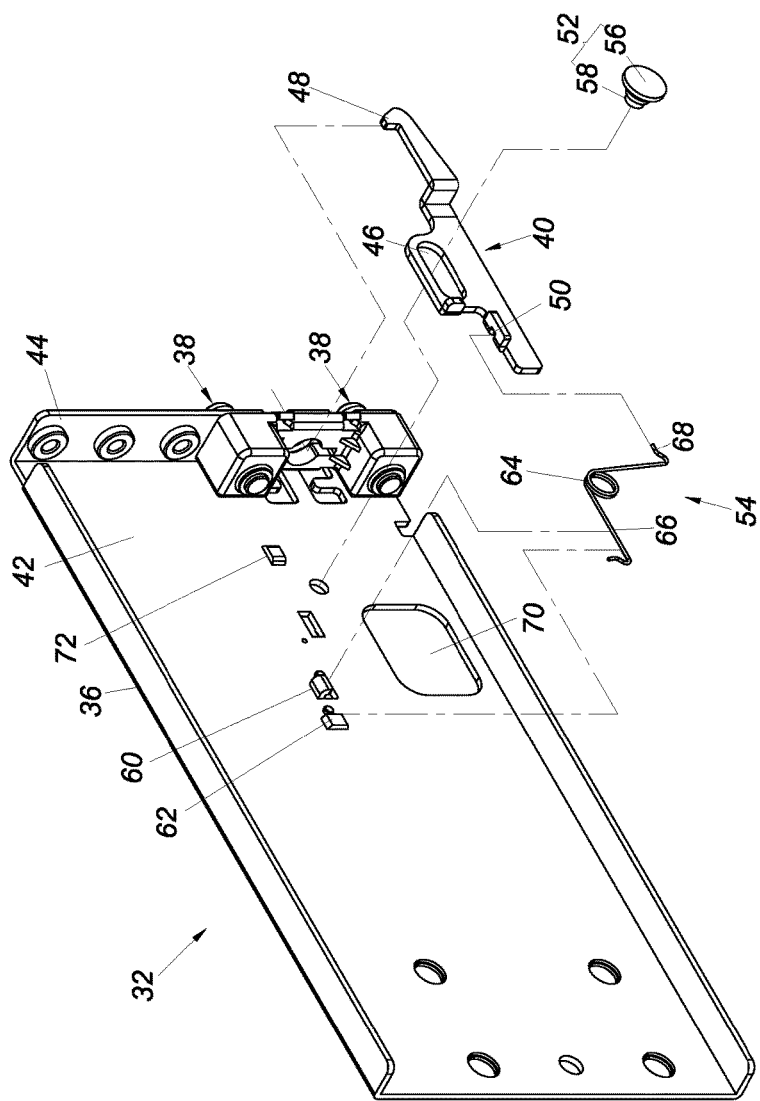
FIG. 2 is an exploded perspective view of one of the bracket devices in FIG. 1.

As shown in FIG. 2 and FIG. 3, the bracket device 32 includes a bracket 36, at least one mounting member 38, and a hook 40. The bracket 36 has a longitudinal plate 42 and an end plate 44 substantially perpendicularly connected to the longitudinal plate 42. The at least one mounting member 38 is mounted on the end plate 44 of the bracket 36 and is implemented in this embodiment as two mounting members 38 by way of example. The hook 40 is movably connected to the bracket 36. Preferably, one of the hook 40 and the bracket 36 has a longitudinal guiding feature 46, and in this embodiment it is the hook 40 that has the longitudinal guiding feature 46 by way of example. More specifically, the hook 40 further includes a hook portion 48 and a mounting portion 50. The hook portion 48 extends through the end plate 44 of the bracket 36. The longitudinal guiding feature 46 lies between the hook portion 48 and the mounting portion 50 and is implemented in this embodiment as a longitudinal hole by way of example.

Preferably, the bracket device 32 further includes a pivotal connection member 52 and an elastic member 54. The pivotal connection member 52 extends through a portion of the longitudinal guiding feature 46 and mounts the hook 40 to the longitudinal plate 42 of the bracket 36. More specifically, the pivotal connection member 52 includes a head 56 and a body 58 connected to the head 56, and the body 58 is smaller than the head 56 in size. The body 58 can pass through a portion of the longitudinal guiding feature 46 and be mounted to the longitudinal plate 42 of the bracket 36. The head 56, on the other hand, is configured to be stopped outside the longitudinal guiding feature 46. The elastic member 54 applies an elastic force to the hook 40. For instance, the longitudinal plate 42 of the bracket 36 has a connecting portion 60, and the elastic member 54 is mounted between the connecting portion 60 of the longitudinal plate 42 and the mounting portion 50 of the hook 40. In this embodiment, the longitudinal plate 42 of the bracket 36 has a supporting portion 62, and the elastic member 54 includes a coiled portion 64, a first elastic portion 66, and a second elastic portion 68, wherein the two elastic portions 66, 68 extend from the coiled portion 64. The first elastic portion 66 is engaged with the connecting portion 60 of the longitudinal plate 42 and has a portion pressed against or adjacent to the supporting portion 62. The second elastic portion 68 is connected to the mounting portion 50 of the hook 40. Preferably, the longitudinal plate 42 of the bracket 36 includes an opening 70 through which an operator can operate the hook 40 with ease.

As shown in FIG. 3, the elastic member 54 applies an elastic force to the hook 40, and the hook 40 stays at a first position P1 in response to the elastic force of the elastic member 54. The hook portion 48 of the hook 40 in this state extends through the end plate 44 of the bracket 36. Preferably, the bracket device 32 further includes a protruding block 72 on the bracket 36 (e.g., on the longitudinal plate 42 of the bracket 36), and one side (e.g., the upper side) of the hook 40 can be pressed against the protruding block 72 to keep the moving path of the hook 40 under control. Besides, each mounting member 38 includes a first mounting portion 74a, a second mounting portion 74b, and a third mounting portion 74c. The first mounting portion 74a is larger in size than the second mounting portion 74b, and the second mounting portion 74b is larger in size than the third mounting portion 74c. Furthermore, the first mounting portion 74a and the second mounting portion 74b are configured to be elastically displaceable (i.e., extensible/retractable) with respect to the end plate 44 of the bracket 36. For instance, each mounting member 38 can be mounted therein with an elastic member in order for the first mounting portion 74a and the second mounting portion 74b to function in this way. As mechanisms enabling such elastic displacement are well known in the art, no further description will be given in this regard.

Referring to FIG. 3 and FIG. 4, the slide rail assembly 20 is mountable to the post 34 via the bracket device 32 on the first rail 24, with the longitudinal plate 42 of the bracket 36 of the bracket device 32 connected to the first rail 24. The post 34 has a plurality of holes such as a first hole 76a, a second hole 76b, and a third hole 76c. The holes 76a, 76b, and 76c are rectangular holes of the same size L1. The size of the first mounting portion 74a of each mounting member 38 is slightly smaller than the size L1 of the holes 76a, 76b, and 76c, and the size L4 of the hook portion 48 of the hook 40 is also slightly smaller than the size L1 of the holes 76a, 76b, and 76c.

During the mounting process, referring to FIG. 5, the bracket 36 is mounted to the post 34 in a first direction D1 such that the first mounting portions 74a of the two mounting members 38 are aligned with and subsequently mounted in the first hole 76a and the second hole 76b respectively. The hook portion 48 of the hook 40 has a guide surface 78 such as an inclined or curved surface. Once displaced in the first direction D1 to a predetermined position, the guide surface 78 is pressed against the post 34 and thereby tilts the hook 40 by an angle from its original state, allowing the hook portion 48 to extend through the third hole 76c. Alternatively, the operator may operate the hook 40 through the opening 70 in order to tilt the hook 40 by the angle with respect to the longitudinal plate 42 of the bracket 36 from its original state such that the hook portion 48 can be passed through the third hole 76c. In either case, the second elastic portion 68 of the elastic member 54 stores an elastic force while the hook 40 is tilted by the angle with respect to the longitudinal plate 42 of the bracket 36.

Referring to FIG. 6 and FIG. 7, after the hook portion 48 of the hook 40 is passed through the third hole 76c of the post 34, the hook 40 returns to its original state in response to the elastic force of the elastic member 54, and the hook portion 48 of the hook 40 is mounted in the post 34 as a result. On the other hand, the first mounting portions 74a of the two mounting members 38 extend through the first hole 76a and the second hole 76b respectively. Thus, the bracket device 32 is mounted on the post 34, and the slide rail assembly 20 is mounted to the post 34 via the bracket device 32. It is worth mentioning that, whenever desired, the bracket device 32 can be detached from the post 34 by operating the hook 40 (e.g., through the opening 70), or more specifically by tilting the hook 40 by an angle so that the hook portion 48 is disengaged from the post 34.

Referring to FIG. 8 and FIG. 9, the slide rail assembly 20 is also mountable to a post 202 via the bracket device 32 on the first rail 24. The post 202 has a plurality of holes such as a first hole 204, a second hole 206, and a third hole 208. The holes 204, 206, and 208 are circular holes of the same size L2. The size of the first mounting portion 74a of each mounting member 38 is larger than the size L2 of the holes 204, 206, and 208, whereas the size of the second mounting portion 74b of each mounting member 38 is slightly smaller than the size L2 of the holes 204, 206, and 208. The size L4 of the hook portion 48 of the hook 40 is also slightly smaller than the size L2 of the holes 204, 206, and 208.

During the mounting process, referring to FIG. 10, the bracket 36 is mounted to the post 202 in a first direction D1 such that the second mounting portions 74b of the two mounting members 38 are aligned with and subsequently mounted in the first hole 204 and the second hole 206 respectively, and the hook 40 is tilted by an angle with respect to the longitudinal plate 42 of the bracket 36 from its original state, allowing the hook portion 48 to pass through the third hole 208. As in the first embodiment, the second elastic portion 68 of the elastic member 54 stores an elastic force while the hook 40 is tilted by the angle with respect to the longitudinal plate 42 of the bracket 36.

Referring to FIG. 11 and FIG. 12, after the hook portion 48 of the hook 40 extends through the third hole 208 of the post 202, the hook 40 resumes its original state in response to the elastic force of the elastic member 54, thereby mounting the hook portion 48 of the hook 40, and hence the bracket device 32, to the post 202.

Referring to FIG. 13 and FIG. 14, the slide rail assembly 20 also can be mounted to a post 302 via the bracket device 32 on the first rail 24. The post 302 has a plurality of holes such as a first hole 304, a second hole 306, and a third hole 308. The holes 304, 306, and 308 are circular holes of the same size L3. The size of the second mounting portion 74b of each mounting member 38 is slightly larger than the size L3 of the holes 304, 306, and 308, whereas the size of the third mounting portion 74c of each mounting member 38 is slightly smaller than the size L3 of the holes 304, 306, and 308. The size L4 of the hook portion 48 of the hook 40 is larger than the size L3 of the holes 304, 306, and 308.

Figure 15:
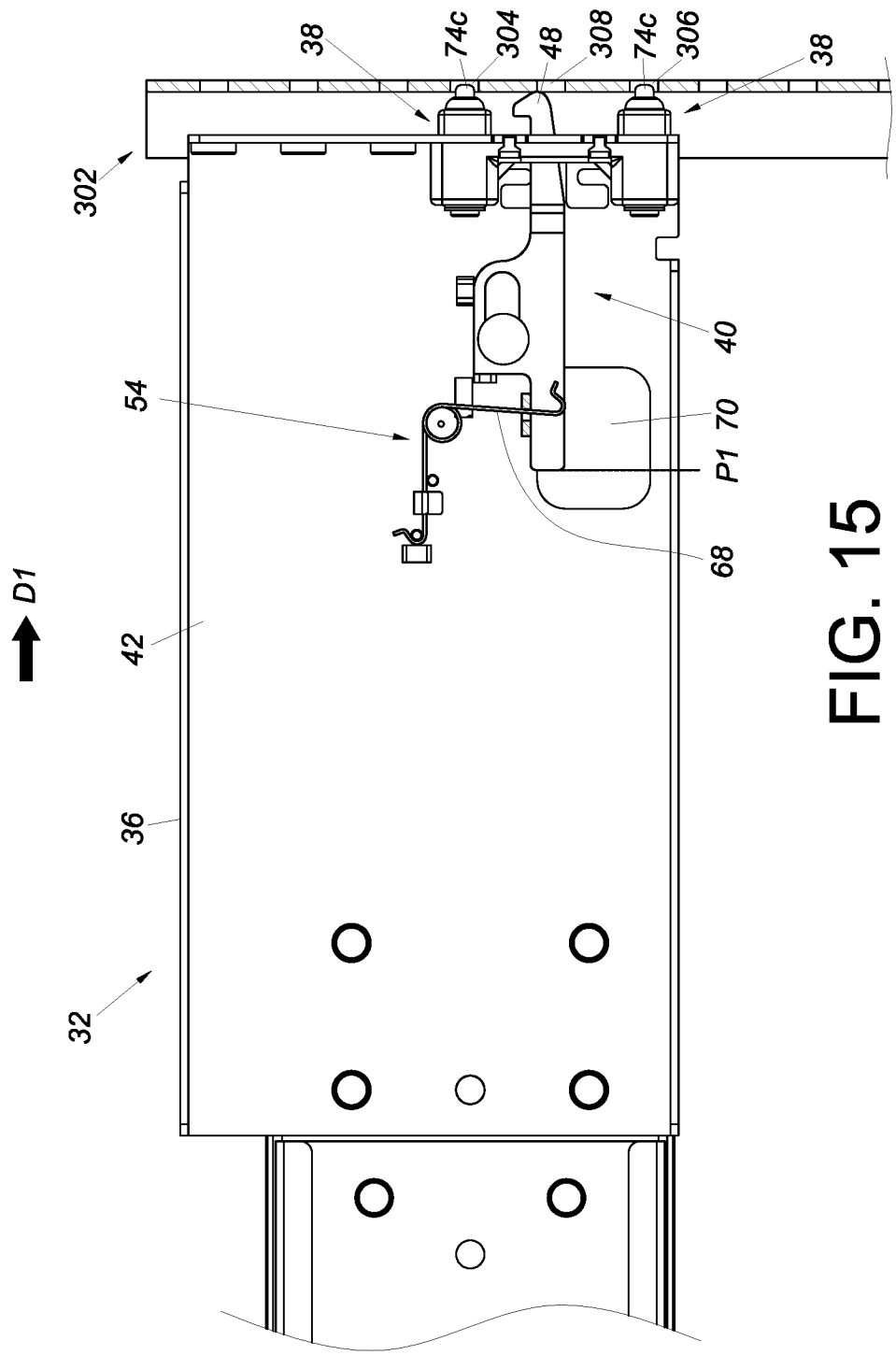
FIG. 15 shows a slide rail assembly being mounted to the rack post in FIG. 13 via a bracket device according to an embodiment of the present invention.

During the mounting process, referring to FIG. 15, the bracket 36 is mounted to the post 302 in a first direction D1 such that the third mounting portions 74c of the two mounting members 38 are aligned with and then passed through the first hole 304 and the second hole 306 respectively. The hook portion 48 of the hook 40, however, is larger in size than the third hole 308 and cannot pass through the third hole 308 in the first direction D1. Once displaced to a predetermined position, therefore, the hook portion 48 of the hook 40 is pressed against the post 302 and is adjacent to the third hole 308.

As shown in FIG. 15 and FIG. 16, the hook portion 48 of the hook 40 cannot pass through the third hole 308 of the post 302 but is pressed against the post 302. In consequence, the hook 40 is displaced in a second direction (e.g., the opposite direction of the first direction D1) from the first position P1, at which the hook 40 extends through the end plate 44 of the bracket 36, to a second position P2, at which the hook 40 is retracted with respect to the end plate 44 of the bracket 36. On the other hand, the elastic member 54, or more specifically the second elastic portion 68 of the elastic member 54, stores an elastic force. By displacing the bracket device 32 further in the first direction D1, the third mounting portions 74c of the two mounting members 38 are mounted to the first hole 304 and the second hole 306 of the post 302 in the first direction D1 respectively, as shown in FIG. 17, and the bracket 36 is mounted to the post 302 as a result. Once the foregoing mounting process is completed, a threaded member 80 can be used to fix the bracket 36 to the post 302. Thus, the first rail 24 of the slide rail assembly 20 is mounted on the post 302 via the bracket device 32. It is worth mentioning that, whenever desired, the bracket device 32 can be detached from the post 302 by first removing the threaded member 80 from the post 302 and then displacing the bracket device 32 in the second direction (e.g., the opposite direction of the first direction D1).

It should be pointed out that, once the bracket device 32 is detached from the post 302, the hook 40 returns from the second position P2 to the first position P1 in response to the elastic force of the elastic member 54, and that it is the longitudinal guiding feature 46 that allows the hook 40 to displace longitudinally with respect to the longitudinal plate 42 of the bracket 36 (i.e., from the first position P1 to the second position P2 and vice versa).

According to the above, the bracket device of the present invention can be mounted on posts of racks of different specifications and hence has industrial applicability.

While the present invention has been disclosed by way of the foregoing preferred embodiments, those embodiments are not intended to be restrictive of the scope of the invention. The scope of patent protection sought by the applicant is defined by the appended claims.

What is claimed is:

1. A bracket device, comprising:
a bracket including a longitudinal plate and an end plate substantially perpendicularly connected to the longitudinal plate;
at least one mounting member mounted on the end plate of the bracket;
a hook; and
a hook guiding feature coupling the hook to the bracket so as to be pivotable and longitudinally displaceable, the hook thereby allowed to be at either one of a first position and a second position different from the first position with respect to the bracket, and at either one of a first pivot angle and a second pivot angle different from the first pivot angle with respect to the bracket;
wherein the hook is extended with respect to the end plate of the bracket when at the first position; and
wherein the hook is retracted with respect to the end plate of the bracket when at the second position.

2. The bracket device of claim 1, wherein the hook guiding feature includes a longitudinal hole and a pivotal connection member, the pivotal connection member extending through a portion of the longitudinal hole and mounting the hook to the bracket, the hook being pivotally displaceable with respect to the bracket upon the pivotal connection member.

3. The bracket device of claim 2, further comprising an elastic member for applying an elastic force to the hook in order for the hook to stay at the first position in response to the elastic force of the elastic member.

4. The bracket device of claim 3, wherein the longitudinal plate of the bracket includes a protruding block, and the hook has a side configured to be pressed against the protruding block.

5. The bracket device of claim 3, wherein the hook further stays at the first pivot angle in response to the elastic force of the elastic member.

6. The bracket device of claim 2, wherein the at least one mounting member includes a first mounting portion and a second mounting portion, and the first mounting portion is larger in at least one of height and width than the second mounting portion.

7. The bracket device of claim 6, wherein the at least one mounting member includes a third mounting portion, and the second mounting portion is larger in at least one of height and width than the third mounting portion.

8. A bracket device adapted for a slide rail, the bracket device comprising:
a bracket mountable on the slide rail, the bracket including an end plate;
a hook; and
a hook guiding feature coupling the hook to the bracket so as to be pivotable and longitudinally displaceable, the hook thereby allowed to be at either one of a first position and a second position different from the first position with respect to the bracket, and at either one of a first pivot angle and a second pivot angle different from the first pivot angle with respect to the bracket;
wherein the hook is extended with respect to the end plate of the bracket when at the first position; and
wherein the hook is retracted with respect to the end plate of the bracket when at the second position.

9. The bracket device of claim 8, further comprising at least one mounting member mounted on the end plate of the bracket and including a first mounting portion, a second mounting portion, and a third mounting portion, wherein:
the bracket includes a longitudinal plate substantially perpendicularly connected to the end plate;
the bracket is mountable on the slide rail via the longitudinal plate;
the first mounting portion is larger in at least one of height and width than the second mounting portion; and
the second mounting portion is larger in at least one of height and width than the third mounting portion.

10. The bracket device of claim 8, wherein the hook guiding feature includes a longitudinal hole and a pivotal connection member, the pivotal connection member extending through a portion of the longitudinal hole and mounting the hook to the bracket, the hook being pivotally displaceable with respect to the bracket upon the pivotal connection member.

11. The bracket device of claim 8, further comprising an elastic member for applying an elastic force to the hook in order for the hook to stay at the first position in response to the elastic force of the elastic member.

12. The bracket device of claim 11, wherein the hook further stays at the first pivot angle in response to the elastic force of the elastic member.

13. A bracket device adapted for mounting a slide rail to a post, the bracket device comprising:
a bracket mountable on the slide rail, the bracket including a longitudinal plate and an end plate substantially perpendicularly connected to the longitudinal plate;
at least one mounting member mounted on the end plate of the bracket;
a hook; and
a hook guiding feature coupling the hook to the bracket so as to be pivotable and longitudinally displaceable, the hook thereby allowed to be at either one of a first position and a second position different from the first position with respect to the bracket, and at either one of a first pivot angle and a second pivot angle different from the first pivot angle with respect to the bracket,
wherein the hook is extended with respect to the end plate of the bracket when at the first position and is retracted with respect to the end plate of the bracket when at the second position;
wherein, when a slide rail is being mounted to a post in a first direction via the bracket device, and the hook is pressed against the post adjacent to a first hole of the post, the hook is thereby displaced from the first position to the second position in a second direction, and the at least one mounting member is mounted to a second hole of the post in the first direction.

14. The bracket device of claim 13, further comprising an elastic member for applying an elastic force to the hook.

15. The bracket device of claim 14, wherein the hook stays at the first position and at the first pivot angle in response to the elastic force of the elastic member.

16. The bracket device of claim 13, wherein, when a slide rail is being mounted to a post in a first direction via the bracket device, and the hook is larger than any hole of the post such that the hook is unable to pass through any said hole in the first direction, the hook is pressed against the post and thereby displaced from the first position to the second position in a second direction.

17. The bracket device of claim 13, wherein the hook guiding feature includes a longitudinal hole and a pivotal connection member, the pivotal connection member extending through a portion of the longitudinal hole and mounting the hook to the bracket, the hook pivotally displaceable with respect to the bracket upon the pivotal connection member,
wherein, when a slide rail is being mounted to a post in a first direction via the bracket device, and the hook is passed through a first hole of the post, the hook is thereby temporarily pivoted to the second pivot angle during the passing and returned to the first pivot angle upon completion of the passing, the hook thereby mounted to the first hole of the post in the first direction, and the at least one mounting member is mounted to a second hole of the post in the first direction.

18. A bracket device adapted for mounting a slide rail to a post with a plurality of holes, the bracket device comprising:
a bracket mountable on the slide rail, the bracket including a longitudinal plate and an end plate substantially perpendicularly connected to the longitudinal plate;
at least one mounting member mounted on the end plate of the bracket, the at least one mounting member including a first mounting portion, a second mounting portion, and a third mounting portion, wherein the first mounting portion is larger in at least one of height and width than the second mounting portion, and the second mounting portion is larger in at least one of height and width than the third mounting portion;
a hook; and
a hook guiding feature coupling the hook to the bracket so as to be pivotable and longitudinally displaceable, the hook thereby allowed to be at either one of a first position and a second position different from the first position with respect to the bracket, and at either one of a first pivot angle and a second pivot angle different from the first pivot angle with respect to the bracket,
wherein the hook is extended with respect to the end plate of the bracket when at the first position and is retracted with respect to the end plate of the bracket when at the second position;

wherein, when the hook is at the second position with respect to the bracket, the third mounting portion of the at least one mounting member is mountable to one of a plurality of holes of a post and the second mounting portion interfaces with a shoulder of said hole.

* * * * *